United States Patent [19]
Higuchi

[11] Patent Number: 5,281,544
[45] Date of Patent: Jan. 25, 1994

[54] METHOD OF MANUFACTURING PLANAR TYPE POLAR TRANSISTORS AND COMBINATION BIPOLAR/MIS TYPE TRANSISTORS

[75] Inventor: Toshihiko Higuchi, Suwa, Japan

[73] Assignee: Seiko Epson Corporation, Tokyo, Japan

[21] Appl. No.: 818,717

[22] Filed: Jan. 9, 1992

Related U.S. Application Data

[62] Division of Ser. No. 734,376, Jul. 22, 1991.

[30] Foreign Application Priority Data

| Jul. 23, 1990 | [JP] | Japan | 2-194235 |
| Jul. 24, 1990 | [JP] | Japan | 2-195865 |
| Aug. 6, 1990 | [JP] | Japan | 2-207743 |
| Oct. 5, 1990 | [JP] | Japan | 2-267605 |

[51] Int. Cl.⁵ .................... H01L 21/265; H01L 29/70
[52] U.S. Cl. ........................... 437/31; 437/32; 437/162
[58] Field of Search ............ 437/31, 32, 162; 148/10, 11

[56] References Cited

U.S. PATENT DOCUMENTS

| 4,772,566 | 9/1988 | Zdebel et al. | 437/32 |
| 4,927,776 | 5/1990 | Soejima | 437/162 |
| 4,956,305 | 9/1990 | Arndt | 437/32 |
| 4,965,220 | 10/1990 | Iwasaki | 437/162 |
| 5,059,549 | 10/1991 | Furuhata | 437/162 |

FOREIGN PATENT DOCUMENTS

| 22881 | 2/1977 | Japan . |
| 27854 | 2/1980 | Japan . |
| 163434 | 8/1985 | Japan . |
| 118528 | 5/1987 | Japan . |
| 62329 | 3/1988 | Japan . |
| 80149614 | 1/1991 | Taiwan . |

OTHER PUBLICATIONS

Japanese Journal of Applied Physics, "Effects of Dipping in an Aqueous Hydrofluoric Acid Solution before Oxidation on Minority Carrier Lifetimes in p-Type Silicon Wafers," H. Shimizu, et al., vol. 28, No. 5.1, May 1989, pp. 743-747.

IEEE Transactions on Electron Devices, "Interfacial and Breakdown Characteristics of MOS Devices with Rapidly Grown Ultrathin $SiO_2$, Gate Insulators", M. Moslehi, et al., vol. ED-34, No. 6, Jun. 1987, pp. 1407-1410.

ESSDERC '89 19th European Solid State Devices Research Conference, "The Influence of Cleaning on $SiO_2$ Growth", R. Wiget, et al., Sep. 11, 1989, pp. 370-373.

Materials Science & Engineering B, "The Role of Atmospheric Oxygen and Water in the Generation of Water Marks on the Silicon Surface in Cleaning Processes", M. Watanabe, et al., vol. B4, No. 1/4, Oct. 1989, pp. 401-405.

Primary Examiner—Olik Chaudhuri
Assistant Examiner—Long Pham
Attorney, Agent, or Firm—W. Douglas Carothers, Jr.

[57] ABSTRACT

A sidewall construction is utilized in the method of manufacture of semiconductor devices comprising planar type bipolar transistors wherein the width of the sidewall construction can be accuracy controlled which, in turn, controls accuracy the channel length of the base of the planar type bipolar transistors. This technique provides ways of preventing short circuiting between the formed transistor collector and emitter regions of the planar type bipolar transistors. The sidewall construction can also be employed in fabrication combination planar type bipolar/MIS type transistors resulting in higher density of these structures over the prior art laterally positioned structures.

13 Claims, 10 Drawing Sheets

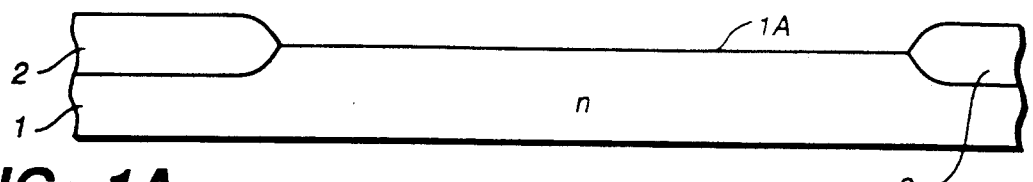
FIG._1A
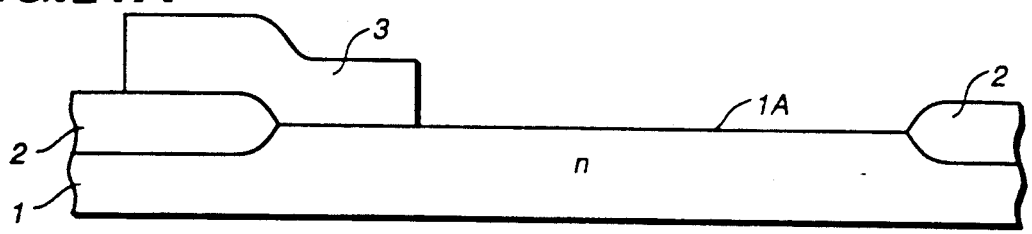
FIG._1B
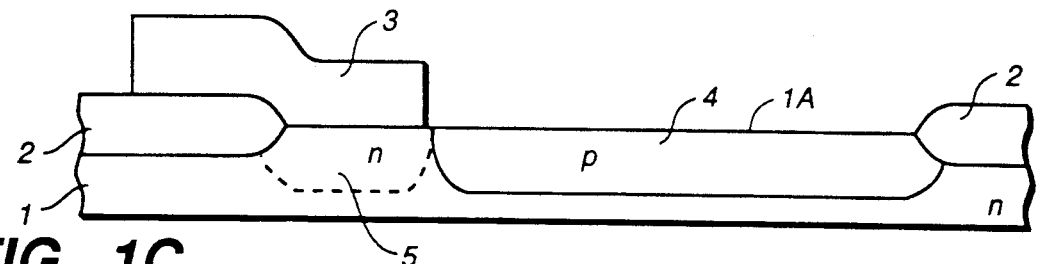
FIG._1C
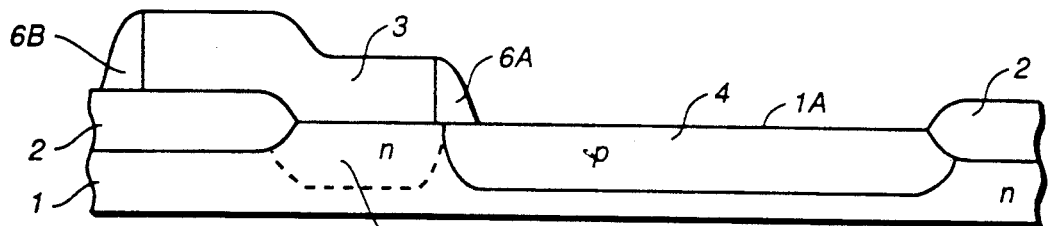
FIG._1D
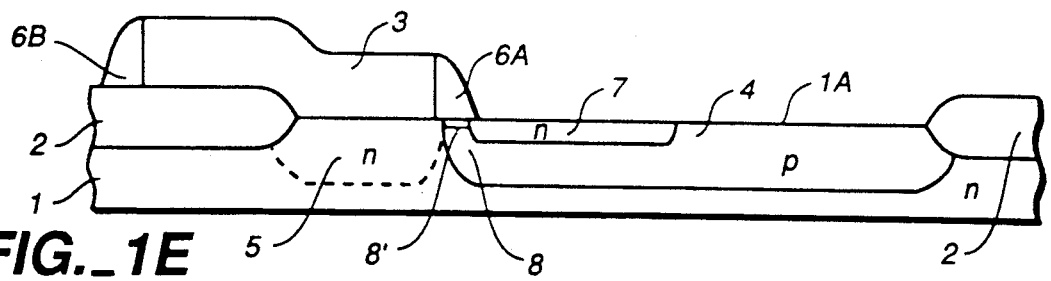
FIG._1E
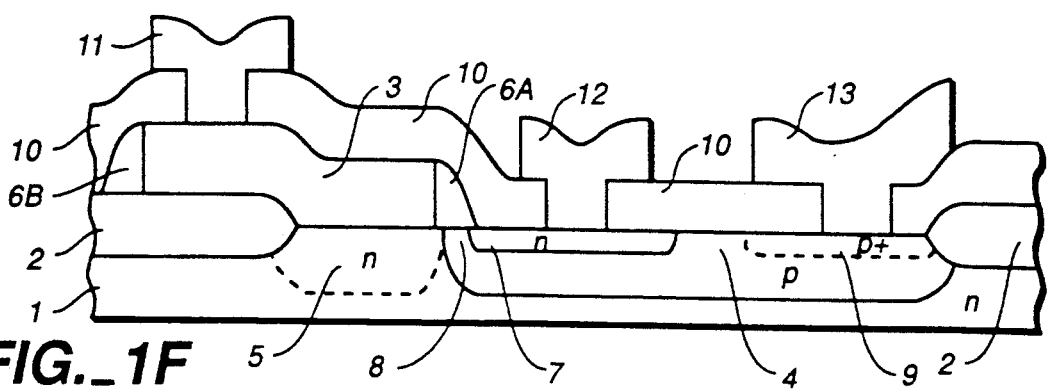
FIG._1F

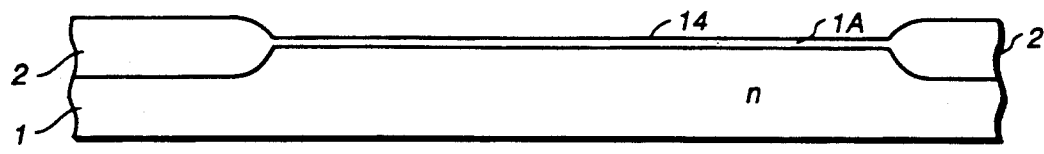
FIG._2A
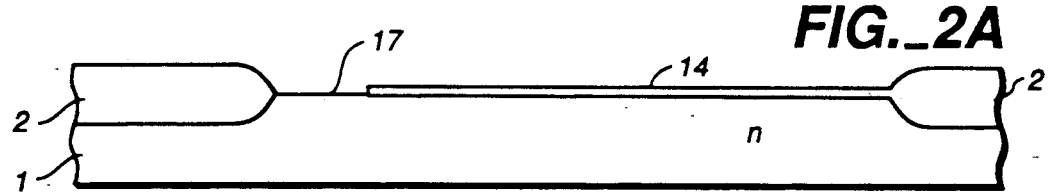
FIG._2B
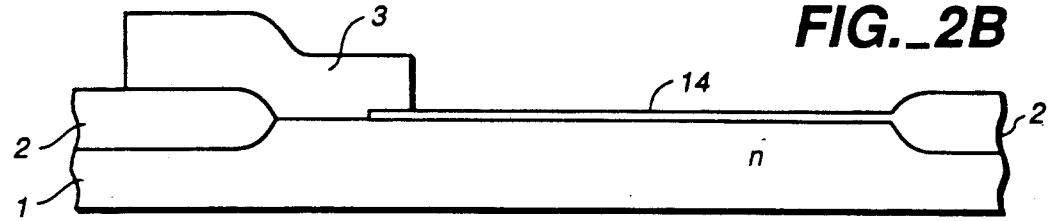
FIG._2C
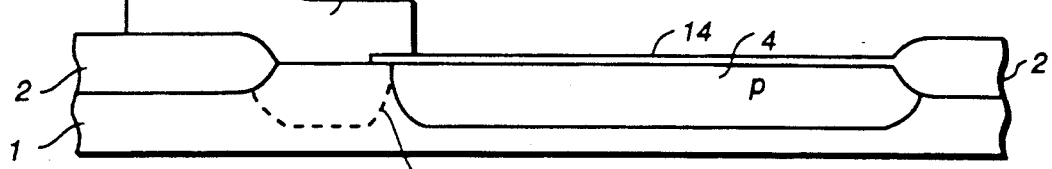
FIG._2D
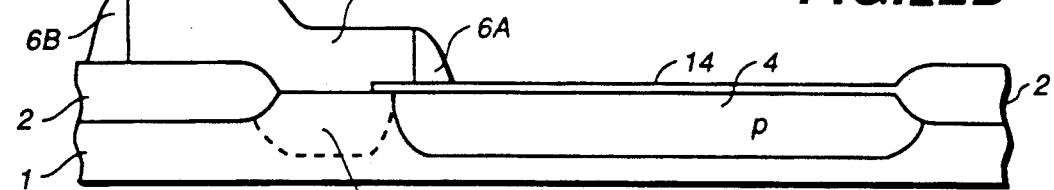
FIG._2E
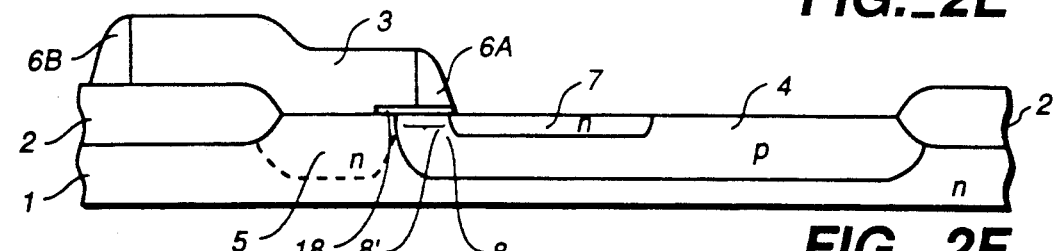
FIG._2F
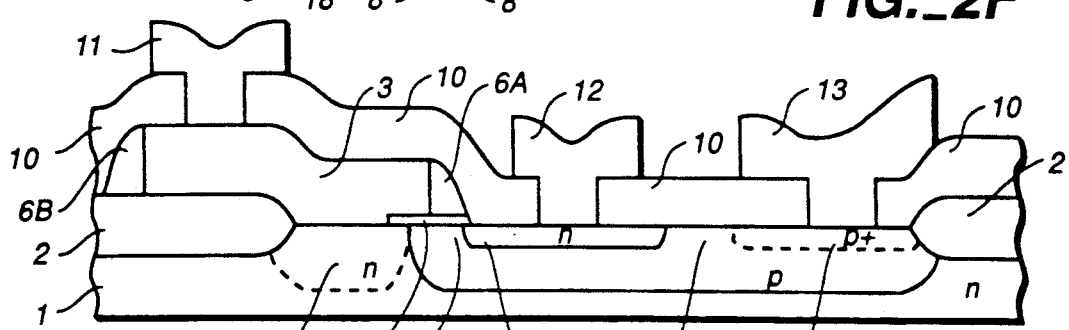
FIG._2G

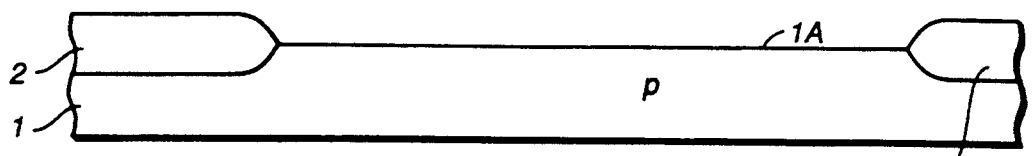
FIG._3A
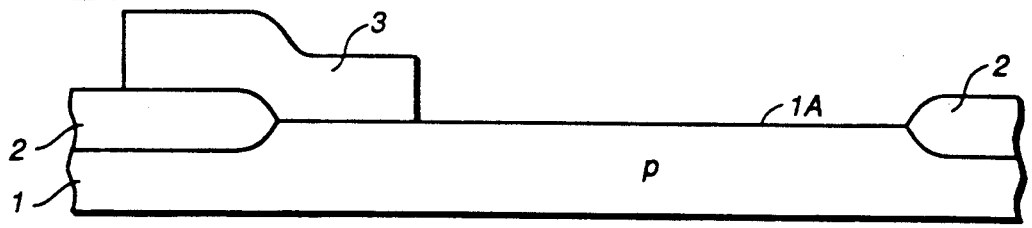
FIG._3B
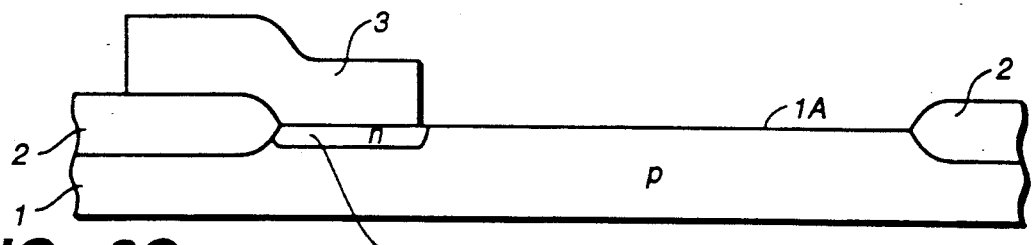
FIG._3C
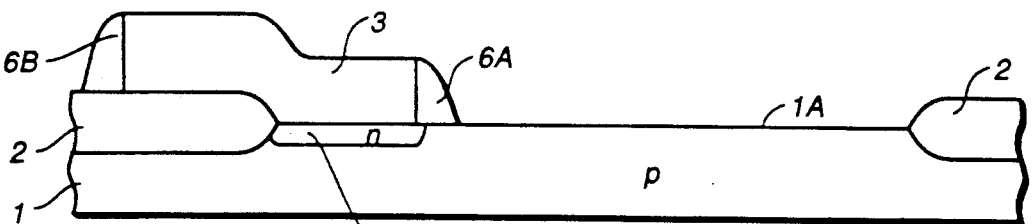
FIG._3D
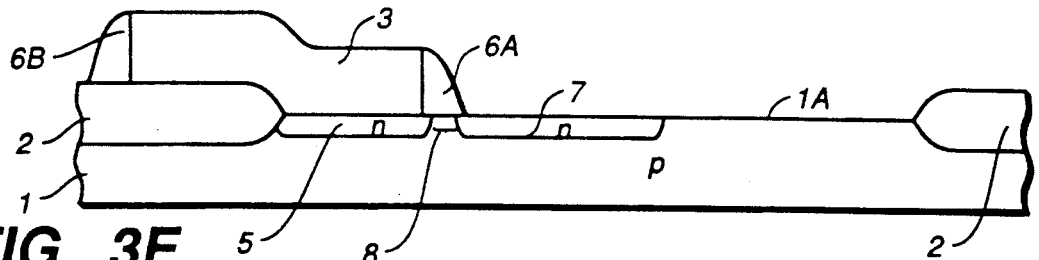
FIG._3E
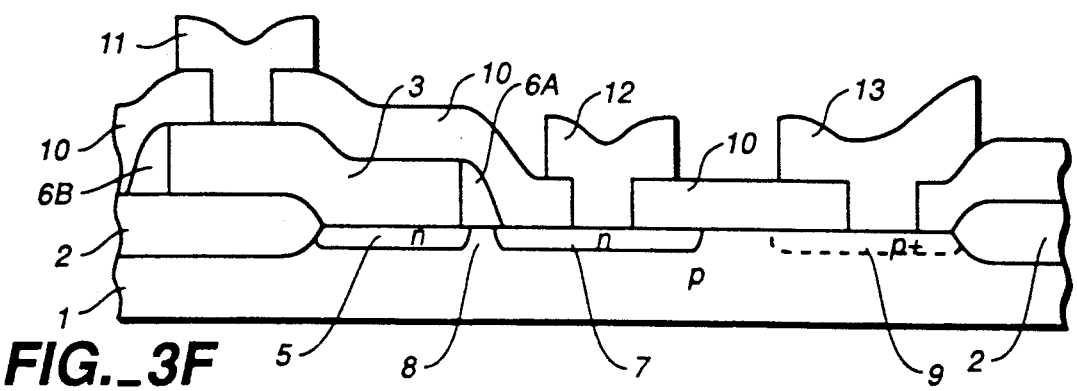
FIG._3F

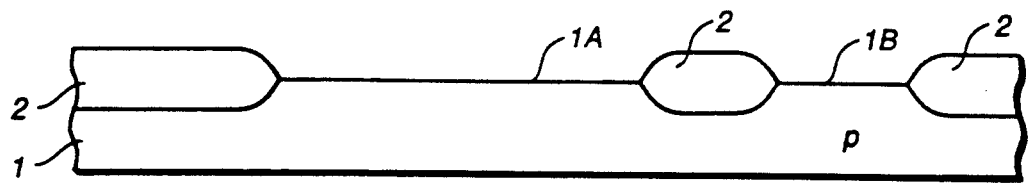
FIG._4A
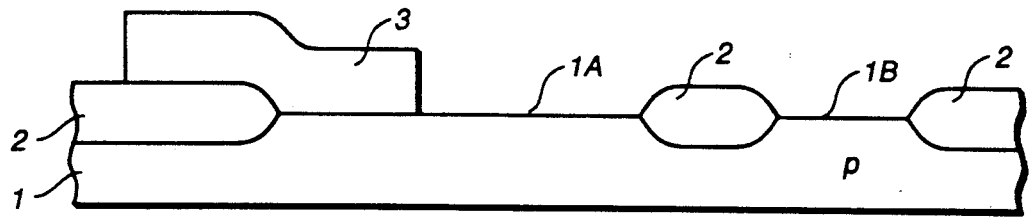
FIG._4B
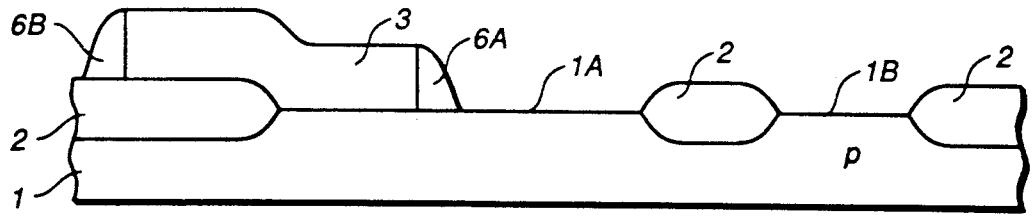
FIG._4C
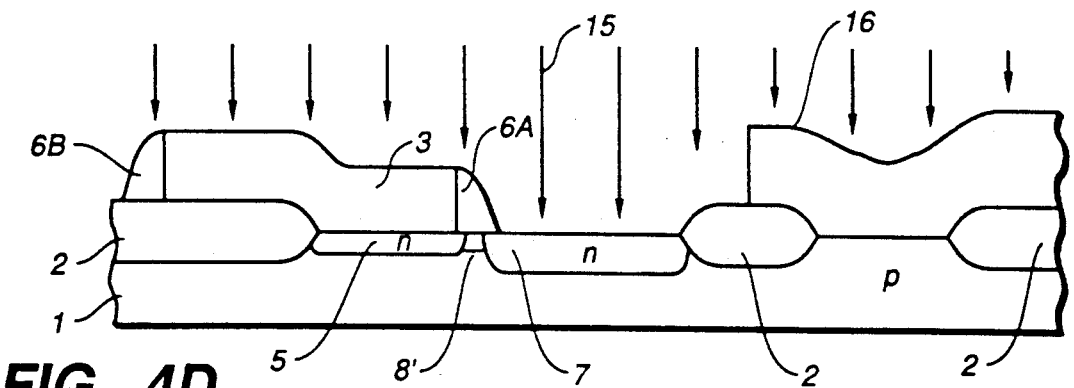
FIG._4D
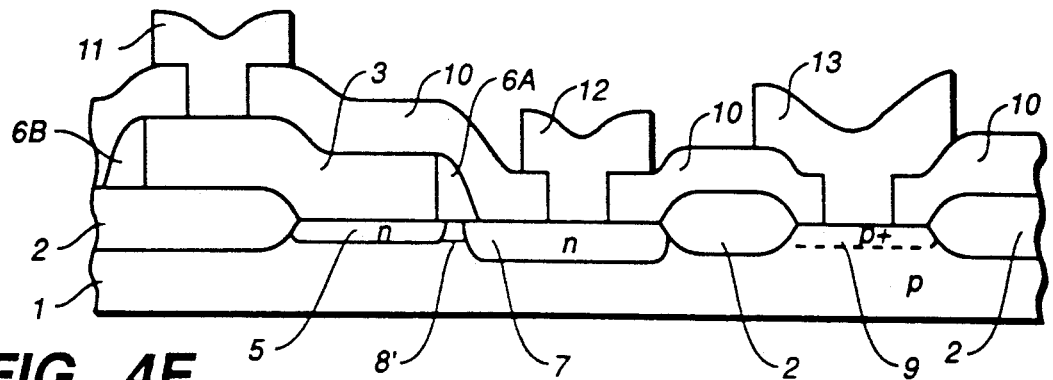
FIG._4E

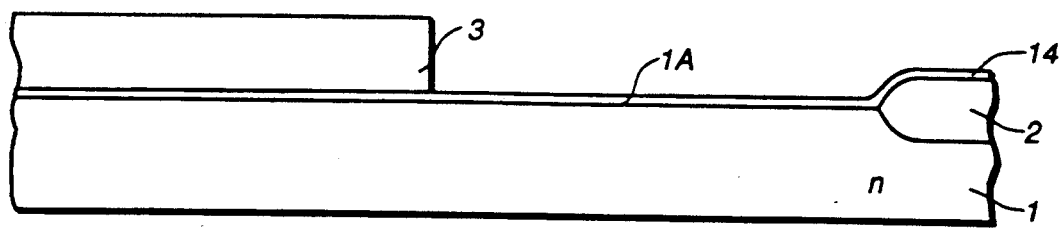
FIG._5A
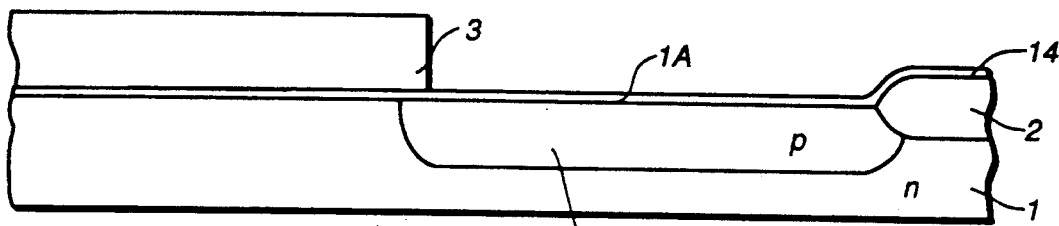
FIG._5B
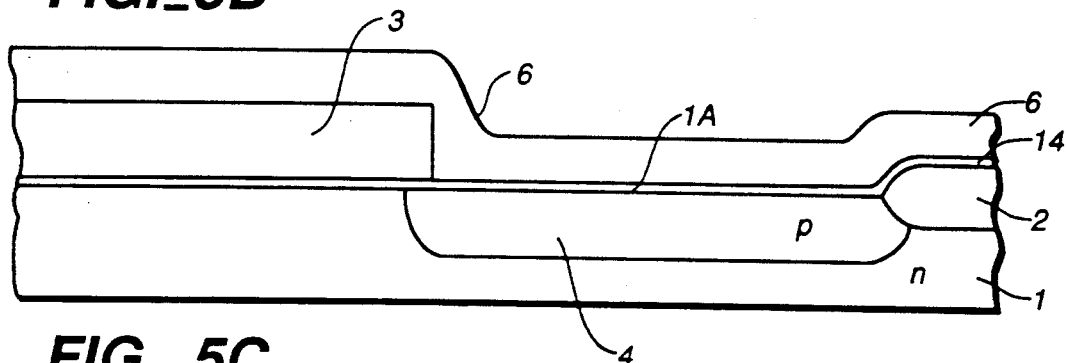
FIG._5C
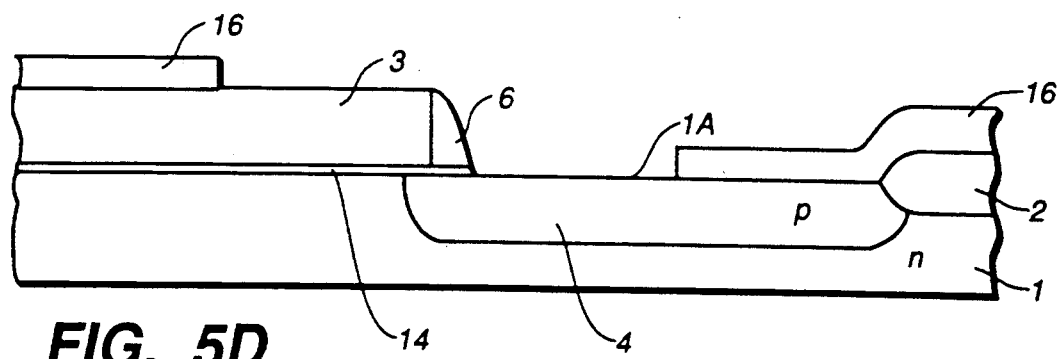
FIG._5D
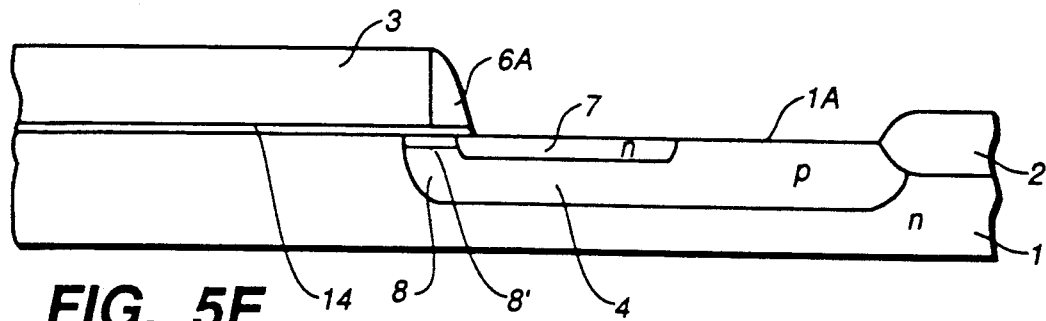
FIG._5E

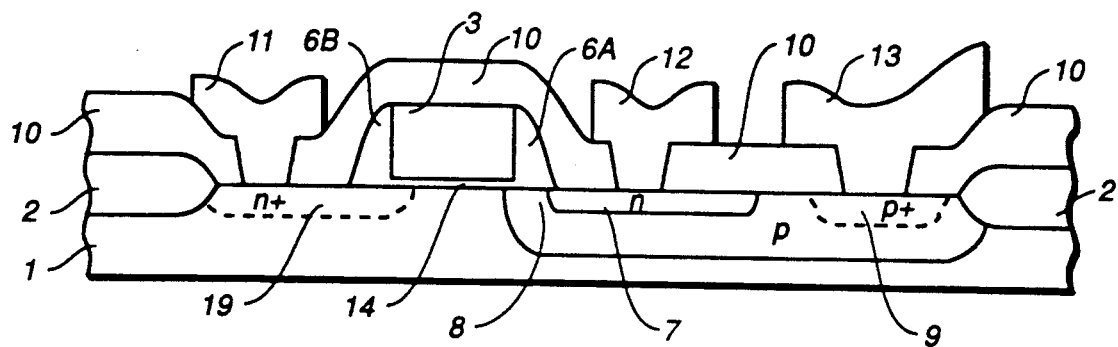
FIG._5F
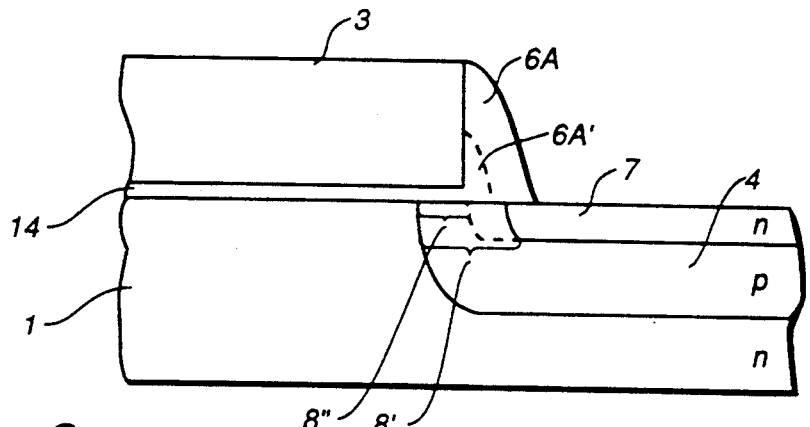
FIG._6
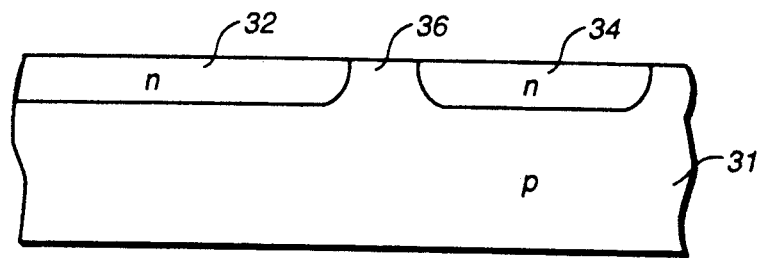
FIG._11
(PRIOR ART)

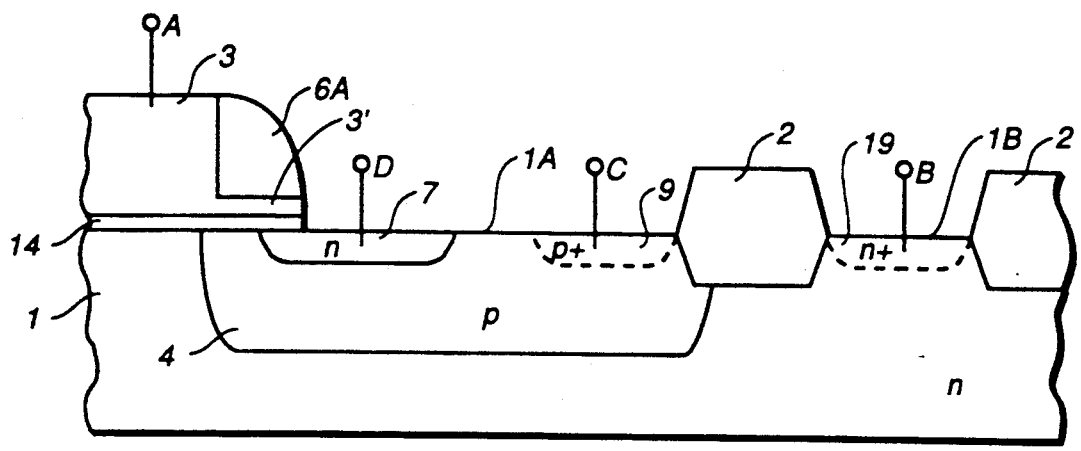
FIG._7
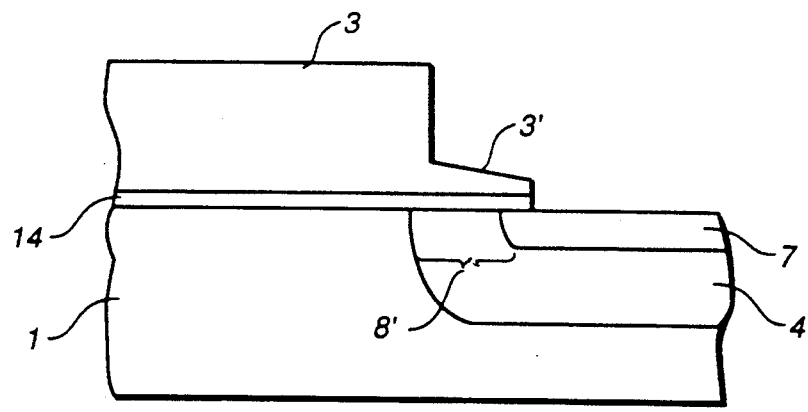
FIG._8A
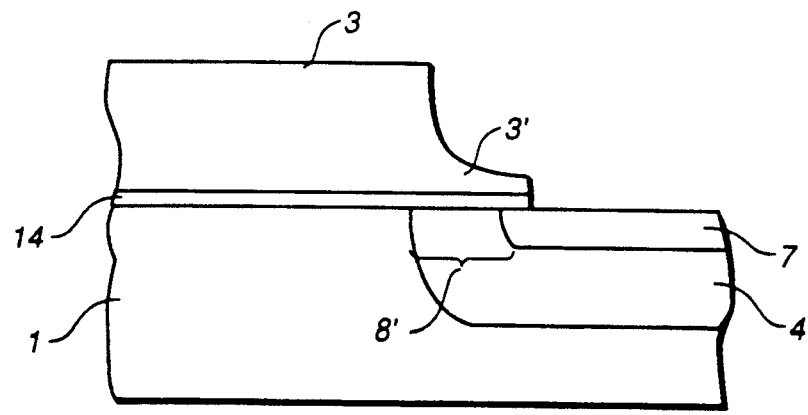
FIG._8B

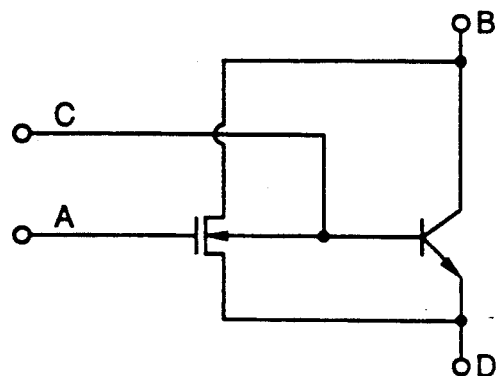
FIG._9A
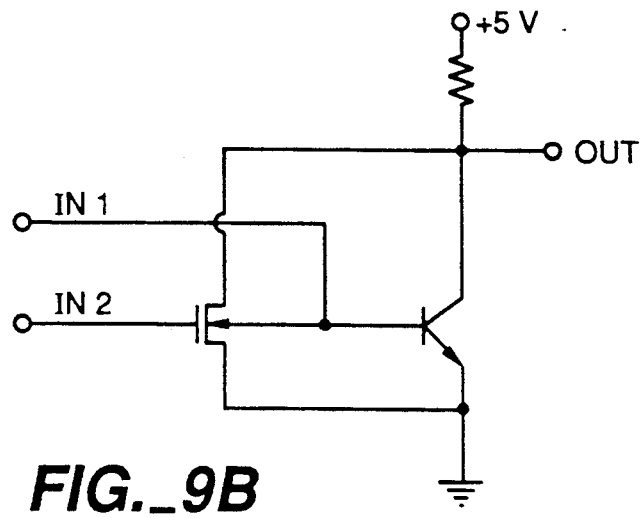
FIG._9B
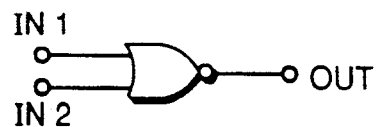
FIG._9C

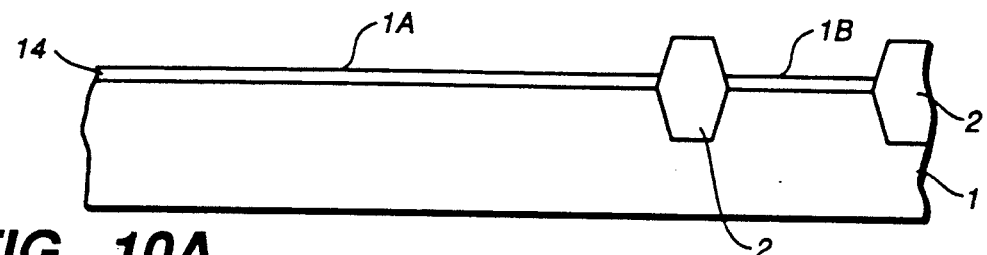
FIG._10A
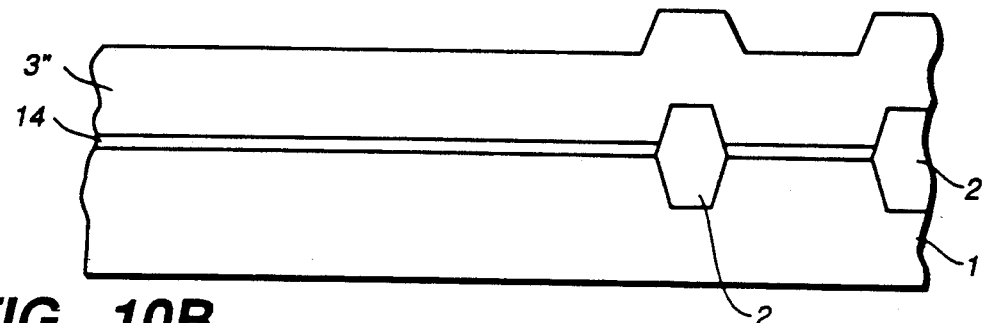
FIG._10B
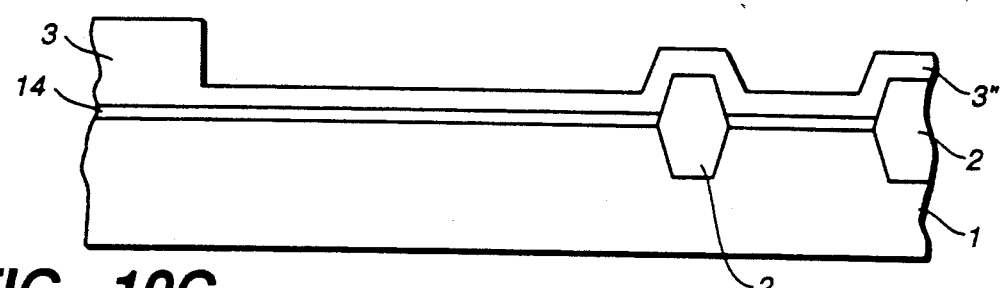
FIG._10C
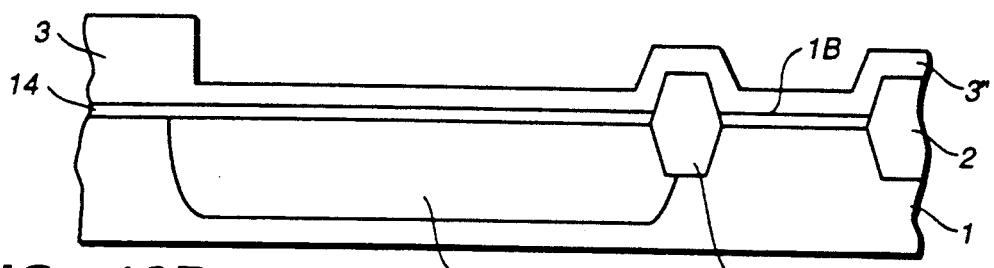
FIG._10D
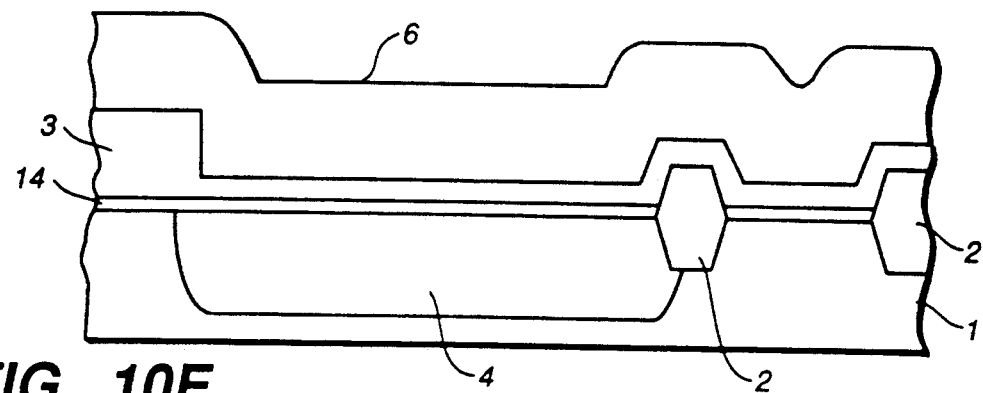
FIG._10E

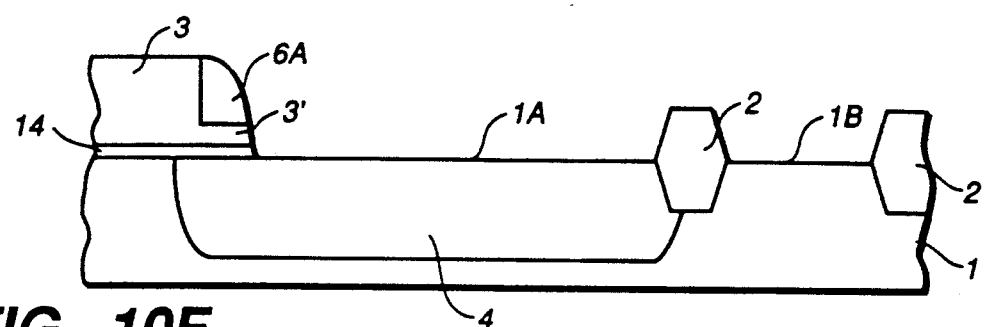
FIG._10F
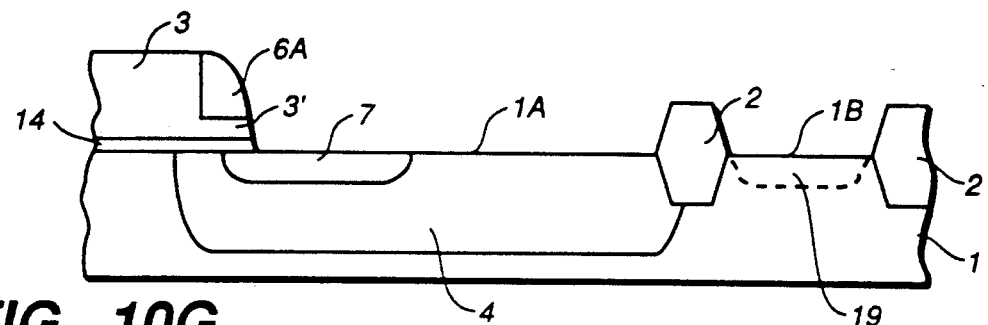
FIG._10G
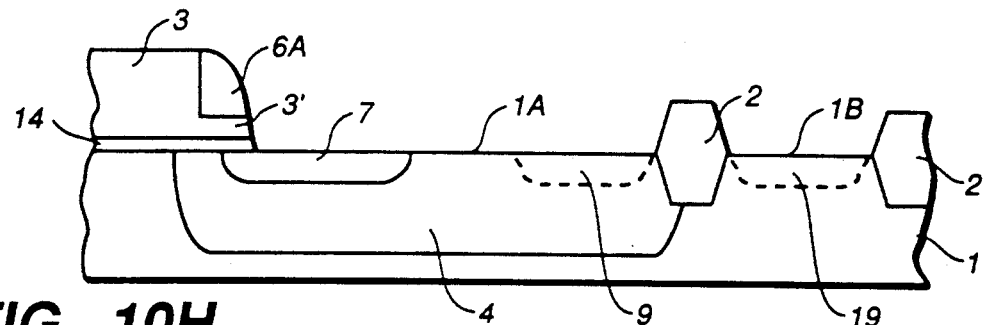
FIG._10H
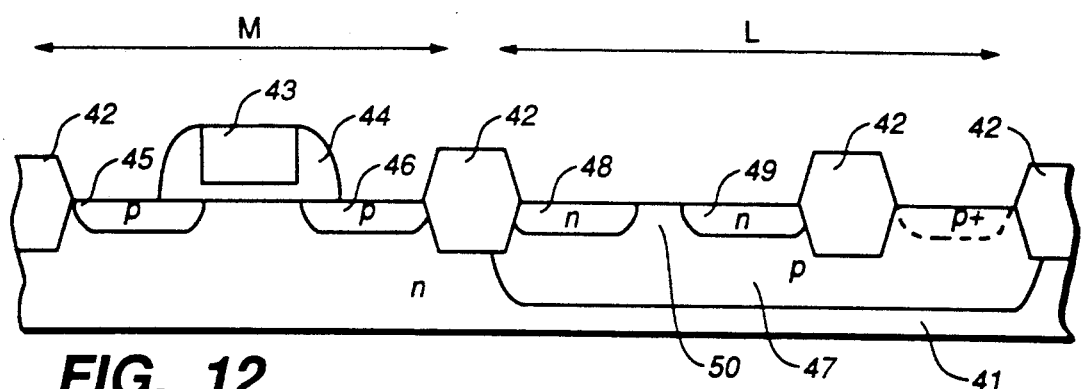
FIG._12
(PRIOR ART)

METHOD OF MANUFACTURING PLANAR TYPE POLAR TRANSISTORS AND COMBINATION BIPOLAR/MIS TYPE TRANSISTORS

This is a division, of application Ser. No. 07/734,376 filed on Jul. 22, 1991.

BACKGROUND OF THE INVENTION

This invention relates generally to a method of manufacturing of active semiconductor devices and, in particular, relates to a method of manufacturing of bipolar transistors formed along the plane of a semiconductor substrate surface and, further, to a combination planar bipolar/MIS semiconductor transistor.

A known method employed for the manufacture of bipolar transistor elements, hereafter referred to as a "planar type bipolar" transistors due to their formation along the plane of semiconductor substrate surface, comprising spatially formed collector and emitter regions formed of first conductive type impurity diffusions between which is a region of a second conductive type that functions as a base. Such a second conductive type region may be a diffusion region or substrate. These regions are all part of a substrate wherein the collector and emitter regions of the first conductivity type are formed on the surface of the substrate, which is of a second conductive type. FIG. 11 shows this structure wherein n-type diffusion regions 32 and 34, for example, are formed in p substrate 31. Diffusion region 32 functions as a collector domain, diffusion region 34 as an emitter domain, and region 36 between the collector and the emitter functions as the transistor base region.

FIG. 12 illustrates a conventional structure of semiconductor device wherein a MIS type transistor and a planar type bipolar transistor are formed in separate regions on the same semiconductor substrate. In FIG. 12, a MIS type transistor is formed relative to region M and a planar type bipolar transistor is formed relative to region L. The MIS type transistor comprises gate electrode 43 separated from substrate 41 by thin insulating film 44. Diffused source domain 45 and drain domain 46 are formed on adjacent sides of gate 43 utilizing an impurity of a conductivity type opposite to that of semiconductor substrate 41. The planar type bipolar transistor is isolated from MIS transistor M by insulating or LOCOS film 42, and comprises an impurity diffusion region 47 of a conductive type opposite to that of semiconductor substrate 41 and two spaced diffusion regions 48 and 49, respectively comprising the collector and emitter regions, having the same conductivity type as substrate 41 formed on the surface of semiconductor substrate 41 in impurity diffusion region 47. The region 50 between collector region 48 and emitter region 49 is the transistor base region.

The rate of current amplification of a bipolar transistor is affected by the width of transistor base region 50 so that it is necessary to make the width of transistor base region 50 smaller in order to increase the current amplification rate or "Hfe" of the bipolar transistor. However, with miniaturization of the size of the transistor, the nonuniformity of the transistor base width materially effects the transistor operating properties in that these properties become nonuniform.

Relative to conventional methods of manufacturing these semiconductor devices, the base width of the planar type bipolar transistor is determined by the diffusion of the impurity that forms the first conductive type diffusion layer. In other words, the base width of a planar type bipolar transistor is difficult to miniature because there is a limit with respect to the resolving power of photolithographic process. Also, the method of expanding the first conductive type impurity diffusion layer by heat diffusion in order to increase Hfe and thereby raise transistor performance tends to be easily affected by disorders occurring during the transistor fabrication process. Thus, the miniaturization of planar type bipolar transistors that retain high performance characteristics cannot be formed with uniform electrical properties in a repeatable manner to provide for high yield bipolar devices.

Further, in order to change the base width of the planar type bipolar transistor, it is correspondingly necessary to make changes in the photomask used in forming the first impurity type diffusions as well as making substantial changes in process conditions to make the desired changes.

Also, in the case of semiconductor devices wherein MIS type transistors and planar type bipolar transistors are mounted on a common semiconductor substrate, an increase in the level of integration of these combination semiconductor devices is difficult because the different types of transistors are formed in spatially separate portions of the semiconductor substrate, as illustrated in FIG. 11.

Lastly, in planar type bipolar transistors of the prior art, the base width is determined by the introduction of impurities in an impurity diffusion layer of the first conductive type. As a result, the base width of a planar type bipolar is difficult to miniaturize due to the limit in the degree of resolution obtainable in lithographic techniques. Also, widening the impurity diffusion layer of the first conductive type by hot diffusion in order to increase Hfe as a simplified way to make a high performance transistor has the effect of bringing disorder to the semiconductor process. Thus, it is not possible to form miniaturized or smaller scale, high capacity planar type bipolar transistors with uniformity relative to the electrical properties of the formed elements.

It is an object of the present invention to resolve the foregoing described problems in offering a method of forming planar type bipolar transistors having uniform electrical properties.

It is another object of this invention to provide a method of manufacturing planar type bipolar transistors of comparatively smaller size to those presently available.

It is a further object of this invention to provide a method of manufacturing of planar type bipolar transistors having high Hfe.

SUMMARY OF THE INVENTION

According to this invention, micro-bipolar transistors can be formed with excellent control over the miniaturization of dimensions with uniform operating parameters by employing a sidewall technique in the formation of adjacently disposed but different conductive type impurity diffusion regions positioned beneath the initially formed sidewall. In particular, the width of the base channel of a lateral bipolar transistor can be micro-controlled by employing the sidewall technique of this invention.

A semiconductor device formed by the method of this invention comprises a planar type bipolar transistor structure having wiring or a conductor formed in one part over a first conductive type semiconductor substrate and another part over an insulating film, a sidewall, comprising insulating film, formed on at least one adjacent side surface of the formed wiring. A base region of a second conductivity type is formed beneath the insulating sidewall adjacent to the wiring with a diffusion region of a first conductive type formed beneath the wiring in the semiconductor substrate constituting the collector region and diffusion region of a first conductivity type formed on the opposite side of the base region constituting the emitter region. With this type of sidewall structure, the base region of the planar type bipolar transistor can be made more narrower without sacrificing transistor electrical properties and operating characteristics.

Further, a semiconductor device formed by the method of this invention includes the use of a sidewall technique to provide for the compact formation of combination planar type bipolar/MIS type transistors resulting in higher density of these structures over the prior art laterally positioned structures.

The method according to this invention provides the following advantages and results. First, it is possible to realize a semiconductor device of more miniaturized dimensions and resulting higher density for planar type bipolar transistors not possible in the prior art by utilizing the transistor base forming technique of this invention the form of a sidewall construction beneath which the base region of the transistor can be formed in a uniform and repeatable manner. Since the base width can be reduced or what I term miniaturized, it is, therefore, possible to form high performance transistors whose Hfe is more than two-fold greater than that of planar type bipolar transistors formed by conventional methods of the prior art. Because the base width is controlled by the sidewall width, it is relatively easy to control transistor Hfe properties and it is also possible to modify Hfe properties with good control by precise control of the sidewall formation.

With respect to the formation of a semiconductor device comprising combination planar type bipolar/MIS type transistors, it is possible to form these two semiconductor elements in a more compact region on the substrate so that the size of the resulting semiconductor device may be reduced as much as ½ to 1/10 over that of the prior art thereby forming a highly integrated semiconductor device. Further, because the base width of the planar bipolar type transistor and the channel length of the MIS type transistor are controlled by the width of a thinned portion of wiring material formed by etching at end of the wiring and by the sidewall width, it is easy to adjust the performance of transistor properties, such as Hfe and $\beta$, and it is also possible to vary this performance through precise control by varying the degree of etching, such as, etched film thickness and shape in forming the sidewall structure.

In particular, because it is possible under the method of this invention to form a sidewall dimension with uniform repeatability, the resulting transistor properties produced also can be assured to have uniformity throughout the semiconductor device.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1A-1F are sequential sectional views of an Example 1 in the manufacture of a semiconductor device for purposes of illustrating the method and a structure of this invention.

FIG. 2A-2G are sequential sectional views of an Example 2 in the manufacture of a semiconductor device for purposes of illustrating the method and a structure of this invention.

FIG. 3A-3F are sequential sectional views of an Example 3 in the manufacture of a semiconductor device for purposes of illustrating the method and a structure of this invention.

FIG. 4A-4E are sequential sectional views of an Example 4 in the manufacture of a semiconductor device for purposes of illustrating the method and a structure of this invention.

FIG. 5A-5F are sequential sectional views of an Example 5 in the manufacture of a semiconductor device for purposes of illustrating the method and a structure of this invention.

FIG. 6 is an enlarged sectional view of a portion of the semiconductor device shown in FIG. 5F.

FIG. 7 is a sectional view of an Example 6 of a semiconductor device comprising combination MIS type/planar type bipolar transistors.

FIGS. 8A and 8B are sectional views showing examples of shapes of the wiring end of the wiring material for forming a semiconductor device of the present invention.

FIG. 9A is a wiring diagram showing the element structure of the semiconductor device of the present invention.

FIG. 9B and 9C are a wiring diagram and corresponding input-output logical diagram for a 2-input NOR circuit formed by utilizing the method and structure of this invention.

FIG. 10A-10H are sequential sectional views of an Example 7 in the manufacture of a semiconductor device for purposes of illustrating the method and a structure of this invention.

FIG. 11 is a sectional view of a semiconductor device of the prior art comprising a planar type bipolar transistor.

FIG. 12 is a sectional view of another semiconductor device of the prior art comprising a combination MIS/bipolar transistor.

DESCRIPTION OF THE PREFERRED EMBODIMENTS

Reference is now made to various embodiments illustrating the method and structures comprising this invention comprising Example 1 (FIGS. 1A-1F), Example 2 (FIGS. 2A-2G), Example 3 (FIGS. 3A-3F), Example 4 (FIGS. 4A-4E), Example 5 (FIGS. 5A-5F), Example 6 (FIG. 7), and Example 7 (FIGS. 10A-10H). Although the explanation of these examples for the purpose of illustration relates to the case of semiconductor devices of the planar type bipolar npn transistors, the method is equally applicable to planar type bipolar pnp transistors.

Reference is now made to FIG. 1A and the explanation of Example 1 of a planar type bipolar transistor. First, an active element separation insulating or LOCOS film 2, e.g., silicon oxide having a thickness of 1 mm, and an active element region 1A are formed on semiconductor substrate 1 of a first conductivity type, such as a silicon monocrystalline substrate having a n-type conductive impurity, e.g., diffused with phosphorus at a concentration of $1\times10^{16}$ cm$^{-3}$. Region 1A is formed by selective etching of film 2 using conventional etching techniques. Next, as illustrated in FIG. 1B, a wiring or conductor 3 is formed on a portion of semiconductor substrate 1 and oxide film 2 utilizing conventional photolithographic and etching techniques so that a portion of wiring 3 is in contact with active region surface 1A of substrate 1. Wiring 3 may be comprised of a polycrystalline silicon film having a thickness of 4,000 Å and diffused with phosphorus at a concentration of $1\times10^{21}$ cm$^{-3}$. Conductor 3 may also be a metal, e.g., a high melting point metal, such as, titanium or tungsten instead of polycrystalline silicon, or multiple layers of metal/polycrystalline silicon.

In FIG. 1C, a second conductive type impurity diffusion layer 4 is formed in semiconductor substrate 1 of a first conductive type. Region 4 is prepared by an ion implantation of boron into the silicon substrate at a implant dose of $5\times10^{-2}$, after which p-type impurity diffusion is formed to a diffusion depth about 0.6 mm to 1 mm upon heat treatment. The impurity density for region 4 may be about $1\times10^{18}$ cm$^{-3}$. This heat treatment process concurrently forms both diffusion regions 4 and 5 wherein the ion implanted p-type region 4 is self matching relative with the active element region 1A exclusive of the region thereof covered or protected by wiring 3, and n-type region 5, which is the collector region of the planar type bipolar transistor, is formed from an impurity diffusion from wiring 3.

In forming diffusion region 4, which will ultimately form the base region of the bipolar transistor, a heat treatment is applied to form the desired diffusion depth. However, since this diffusion also proceeds in a lateral direction as well as downward, the length of the base region, i.e., the distance between the collector region 5 and emitter region 7 (discussed later) becomes too long thereby rendering it difficult to make a lateral bipolar transistor with high Hfe. In order to prevent this from occurring, diffusion of an opposite conductivity type via wiring 3 is provided from the opposite lateral direction from the lateral progression of the diffusion of region 4. Also, the impurity density needs to be high in order to provide good electrical conducting for wiring 3. In this situation, therefore, the impurity density of region 5 needs to be at least equal to and preferably more than the impurity density of region 4, i.e., approximately $1\times10^{17}$ cm$^{-3}$ to $1\times10^{21}$ cm$^{-3}$. In other words, the impurity density of region 4 should be lower than that of region 5 and the balance between them as set forth above is an important factor.

Next, a 0.5 μm (5,000 Å) silicon oxide film is formed on the entire semiconductor surface utilizing CVD. This is followed by selective anisotropic etching, such as, reactive ion etching (RIE), to form the insulating sidewalls 6A and 6B over side surfaces of wiring 3, as illustrated in FIG. 1D. If the etch back thickness of the 0.5 μm deposited film is about 6,000 Å, the resulting width of sidewalls 6A, 6B formed by anisotropic etching are about 3,000 Å. The width of sidewall 6A is controlled by observing the luminescent spectrum of the removed materials during watching and determining how much time etching should be extended after the end detection point wherein the luminescent spectrum changes, i.e., from a whole surface oxide film 6 to one wherein silicon substrate 1 is exposed. This detection technique is well known in the art.

Next, as shown in FIG. 1E, a first conductive type impurity diffusion region 7 is formed in diffusion layer 4 adjacent to formed sidewall 6A. This is accomplished by the employment of a photoresist mask and photolithographic techniques and the ion implant, e.g., arsenic implanted at $5\times10^{15}$ cm$^{-2}$, via a masked region forming diffusion region 7. By means of heat treatment, n-type impurity diffusion region 7 is formed to a depth of 0.2 mm. As a result, an npn-type planar type bipolar transistor is formed comprising first conductive type impurity diffusion region 5 formed on the surface of silicon substrate 1 beneath wiring 3 functioning as the collector domain, first conductive type impurity diffusion region 7 functioning as the emitter domain, and a narrow portion 8 in second conductivity type impurity diffusion region 4 comprising a narrow diffusion width 8' beneath sidewall 6A functioning as the transistor base region. The planar type bipolar transistor is completed with the formation of insulating layer 10, followed by the selective etching to form vias for the deposit of metal electrodes 11-13, i.e., collector electrode 11, emitter electrode 12 and base electrode 13. For good ohmic contact, a p+ region 9 is formed at base electrode 13.

In utilizing the method in the case of Example 1, in situations where the diffusion depth between wiring 3 and first conductive type region 5 is large, this first conductive type diffusion region 7 extends to be also formed beneath sidewall 6A. Further, in cases when the base width 8' of the transistor is extremely narrow due to the extension of both diffusion regions 5 and 7 beneath sidewall 6A, short circuiting can result between the formed transistor collector and emitter. In order to avoid this situation, it has been necessary to control the impurity diffusion conditions and the first conductive type impurity concentration in wiring 3.

FIGS. 2A-2G illustrate Example 2 relative to the method of manufacture of this invention as explained in connection with Example 1. Thus, identical components having the same numerical identification and the steps employed in the manufacture of the planar type bipolar transistor of Example 2 are the same expect as modified in the following discussion. After forming element separation insulating region 2 over semiconductor 1 and active element region 1A, thin insulating film 14 is formed on active element region surface 1A by thermal oxidation, as shown in FIG. 2A. As an example, a silicon oxide film having a thickness of about 400 Å is formed on surface 1A by heat treatment at a temperature of about 900° C. in an oxygen atmosphere. In the next step, this thin insulating film 14 is partially removed by conventional photolithographic masking and etching techniques resulting in an exposed region 17 exposing surface 1A as shown in FIG. 2B. This is followed by the formation of wiring 3 which covers exposed region 17 and a portion of oxide film 14 and LOCOS 2 as shown in FIG. 2C. Then, second and first conductivity type diffusion regions 4 and 5 are formed in substrate 1 (FIG. 2D), followed by sidewalls 6A, 6B on conductor layer 3 (FIG. 2E) as previously explained in the case of Example 1. Next, thin insulating film 14 is removed from surface 1A leaving thin oxide film portion 18 beneath a portion of wiring 3 and sidewall 6A. Then, first conductive type region 7 is formed by thermal diffusion as shown in FIG. 2F. The depth of diffusion forming region 7 is shallow so that it can be formed using a short heat treatment, for example, by employing a halogen lamp for a short period of time, e.g., 30 seconds, with a temperature of about 1,000° C.

As in the case of Example 1, where the base width 8' of the transistor is extremely narrow due to the extension of both diffusion regions 5 and 7 beneath sidewall 6, short circuiting can possibly result between the formed transistor collector and emitter regions 5 and 7. However, in the case of Example 2, the formed base width will not become too short in length as a result of impurity diffusion from wiring 3 forming region 5 because the portion of wiring 3 and substrate 1 that are in direct contact with one another is separated from sidewall 6A by thin oxide film portion 18. As a result, the control of impurity diffusion conditions and the first conductive type impurity concentration in wiring 3 is not so critical in the Example 2 embodiment as it is in the Example 1 embodiment. Also, in Example 2, since thin oxide film 14 is present relative to a portion of wiring 3, diffusion into substrate 1 to form region 5 occurs in regions where film 14 is not present. Thus, region 5 is not shifted toward diffusion region 4 as much as in the case of Example 1.

Example 3 illustrated in FIGS. 3A-3F, is formed in the same manner as explained in connection with Example 1 in FIGS. 1A-1F. Thus, identical components having the same numerical identification and the steps employed in the manufacture of the planar type bipolar transistor of Example 3 are the same expect as modified as explained in the following discussion. In Example 3, semiconductor substrate 1' is of a second conductive type so that it is possible to form base region 8 without the need for preparation of ion implanted diffusion region 4 of second conductive type impurity ions as utilized in Example 1. Thus, after the selective ion implant of region 7, a thermal diffusion is performed by heat treatment to bring about the concurrent formation of diffusion regions 4 and 7 of the first conductivity type.

Reference is now made to Example 4 of another form of a planar type bipolar transistor illustrated in FIGS. 4A-4E. In FIG. 4A, element separation insulating film 2 and an active element regions 1A and 1B are formed on semiconductor substrate 1' of a second conductive type, e.g., a p-type conductive impurity boron diffused into a silicon monocrystalline substrate at a concentration of $1 \times 10^{16}$ cm$^{-3}$. Element separation insulating film 2 has a thickness of about 1 mm. Regions 1A and 1B is formed by selective etching of film 2 using conventional etching techniques. Next, as illustrated in FIG. 3B, wiring wiring 3 is formed on a portion of semiconductor substrate 1' and oxide film 2 utilizing conventional photolithographic and etching techniques so that a portion is in contact with active region surface 1A of substrate 1. Conductor 3 may be comprised of a polycrystalline silicon film having a thickness of 4,000 Å and diffused with phosphorus at a concentration of $1 \times 10^{21}$ cm$^{-3}$, but with respect to Example 4, either a first or second conductive type impurity may be employed. Wiring 3 may also be a metal, e.g., a high melting point metal, such as, titanium or tungsten instead of polycrystalline silicon, or multiple layers of metal/polycrystalline silicon.

Next, as shown in FIG. 4C, a silicon oxide film having a thickness of about 0.5 μm is formed over the entire surface of semiconductor substrate 1 by means of conventional CVD. This is followed by selective anisotropic etching, such as, reactive ion etching (RIE), to form the insulating sidewalls 6A and 6B over side surfaces of wiring 3 as illustrated in FIG. 4C. If the etch back thickness of the 0.5 μm deposited film is about 6,000 Å, the resulting width of sidewalls 6A, 6B formed by anisotropic etching are about 3,000 Å. Next, as shown in FIG. 4D, after masking active region 1B with resist mask 16 for forming base electrode 13, ion implant of impurity 15 of a first conductivity type is accomplished. Then, photoresist mask 16 is removed, thermal treatment is performed causing the first conductive type impurity to diffused into wiring 3 and into semiconductor substrate 1 beneath wiring 3 forming impurity diffusion region 5 which also slightly extends beneath sidewall 6A and functions as the collector domain of the transistor. Concurrently, first conductive type impurity diffusion region 7 is formed in active element region 1A of substrate 1 adjacent to and slightly beneath sidewall 6A and functions as the emitter domain of the transistor. The resulting region between the formed collector and emitter functions as the transistor base 8.

It should be understood that in the practice of the method of this invention, variations in the width of sidewall 6A can be accomplished by varying the film thickness of the initially formed insulating film subsequently etched by anisotropic dry etching to form sidewall 6A. In the foregoing examples, sidewalls 3,000 Å wide were formed by etching on the order of 6,000 Å. The region of the narrowed second impurity diffusion layer formed at this time by first conductivity type impurity diffusion region 7, i.e., width 8' of base region 8, is about 2,000 Å. On the other hand, when the insulating film of about 8,000 Å is etched via anisotropic etching, it becomes 2,000 Å. The first conductive type impurity diffusion layer formed by the sidewall extends farther in the direction of wiring 3 than when the sidewall has the width of 3,000 Å. As a result, the width 8' of base 8 is reduced to about 1,000 Å. Thus, it is to be seen that the Hfe, which determines the capacity of the transistor, can be easily controlled by the method of manufacture of this invention due to precise control over the formation of the width of the base channel 8' by means of the control of thickness of the formed oxide film resulting in sidewall 6A of predetermined width.

Example 5, illustrated in FIGS. 5A-5F, comprises a planar type bipolar transistor formed in a manner similar to that explained in connection with previous examples, in particular Example 2 in FIGS. 2A-2F. Thus, identical components having the same numerical identification and the steps employed in the manufacture of the planar type bipolar transistor of Example 5 are the same expect as modified in the following discussion and explanation. In Example 5, beginning with FIG. 5A, element separation insulating or LOCOS film 2, comprising a silicon oxide film having a thickness of about 1 mm, and active element region 1A are formed on semiconductor substrate 1 of a first conductive type, e.g., a n-type impurity doped silicon monocrystalline substrate with phosphorus having a diffused concentration of $1 \times 10^{16}$ cm$^{-3}$. Next, a thin insulating film 14 of silicon oxide having a thickness of about 300 Å is formed over active element region 1A and the substrate surface by heat treatment in an oxygen atmosphere. Wiring 3 comprising a polycrystalline silicon film is then formed over thin insulating film 14 employing conventional photolithographic and etching techniques. Polysilicon wiring 3 may be, for example, about 400 Å thick and diffused with an impurity to provide a desired level of conductivity. On the other hand, wiring 3 may alternatively be a high melting point metal, such as, molybdenum or tungsten or a compound of silicon and a high melting point metal instead of polycrystalline silicon.

Next as shown in FIG. 5B, diffusion region 4 is formed in substrate 1 comprising an impurity implant of a second conductive type. As an example, diffusion region 4 may be implanted with boron providing a p-type conductivity at a concentration of $5 \times 10^{14}$ cm$^{-2}$ to a diffusion depth of about 0.6 mm to 1 mm by conventional heat treatment. Since the ion implant is not effective in the region of substrate 1 beneath wiring 3 or beneath element separation insulating film 2, region 4 is formed over active region 1A matching the confines of that region. This is followed, in FIG. 5C, by the formation of insulating film 6 over the entire surface of substrate 1, e.g., CVD deposition of a 0.5 μm silicon oxide film. Sidewall 6A of insulating film 6 is then formed on the side surface of wiring 3 by employing anisotropic etching of film 6, e.g., RIE. Dry etching removes film 6 as well as thin film 14 underlying it in the region 1A. In particular, if the etch back thickness of the 0.5 μm deposited film is about 6,000 Å, the resulting sidewall width formed by anisotropic etching is about 3,000 Å.

After formation of sidewall 6A, photoresist mask 16 is formed on substrate by means of conventional photolithographic techniques exposing a portion of active element region 1A as illustrated in FIG. 5D. Then, as shown in FIG. 5E, diffusion region 7 of a first conductivity type is formed in the portion of surface 1A of second conductive type diffusion region 4 adjacent to sidewall 6. Diffusion region 7 may be formed by ion implant of arsenic at a concentration of $5 \times 10^{15}$ cm$^{-2}$ to form a n-type impurity diffusion region 4 and through heat treatment is diffused to a depth of about 0.2 mm in substrate 1. Thus, a npn-type planar type bipolar transistor is formed comprising n-type silicon substrate 1 beneath wiring 3 functioning as the collector domain, in-type impurity diffusion region 7 functioning as the emitter domain and region 8 comprising a narrow diffusion channel 8' beneath sidewall 6A function as the transistor base. As shown in FIG. 5F, the npn planar type bipolar transistor is completed with the formation of insulating layer 10, followed by the selective etching to form vias for the deposit of metal electrodes 11–13, i.e., collector electrode 11, emitter electrode 12 and base electrode 13. For good ohmic contact, a p+ region 9 is formed at base electrode 13 and n+ region 19 is formed at collector electrode 11.

The method of manufacturing semiconductor device of this invention has the capacity of pre-application of variations in the width of sidewall 6A relative to the various described embodiments by varying the film thickness of the insulating film etched by anisotropic dry etching in order to form sidewall 6A. This variation in sidewall thickness is illustrated in FIG. 6. In the above examples, a 3,000 Å wide sidewall was formed by anisotropic etching an oxide layer having a thickness on the order of 6,000 Å. The resulting narrow channel region 8', formed in second impurity diffusion region 4, is approximately 4,000 Å. On the other hand, when oxide film 6 is approximately 8,000 Å thick and thereafter etched via anisotropic etching, the resulting width of sidewall 6A is reduced to about 2,000 Å, as indicated at 6A'. Further, diffusion region 7 extends farther in the direction of wiring 3 as indicated at dotted line 7'. Correspondingly, the channel width of base region 8 is reduced to approximately 2,000 Å, as indicated at 8". Further, sidewall 6A formed by dry etching can be selectively etched to form narrower sidewall 6A'. Thus, in any case, the amount of etching determines the width of sidewall 6A which correspondingly determines the width of base channel 8'. Thus, it is to be seen that the current amplification rate, Hfe, which determines the capacity of the transistor, can be easily but precisely controlled by controlling the width of sidewall 6A in accordance with the method of this invention.

Thus, the characteristic of a lateral bipolar transistor is that impurity diffusion region 4 and regions 5, 7 of different conductivity types are formed adjacently in the lateral direction. In particular, Hfe is determined by the width of the base diffusion region 8, 8' or 8" relative to two diffusion regions. The width of the base or p type region 8, 8' or 8" is of a predetermined amount by employing a method of forming the width of base region 8' by ion implantation prior to forming sidewall 6A and thereafter forming collector/emitter region after forming sidewall 6A, as illustrated in FIGS. 5A–5E and 6. On the other hand, the width of base region 8 is formed after formation of side wall 6A followed by formation of collector/emitter region 7, as illustrated in FIGS. 1A–1F. In any case, the base width can be controlled by controlling the size of sidewall 6A.

Reference is now made to FIG. 7 illustrating Example 6 of a semiconductor device comprising the combination of an MIS type transistor and a planar type bipolar transistor. Components in FIG. 7 that have correspondence with components of previous embodiments have the same numerical identification. An active element region 1A and element isolation region 2 are formed on the surface of semiconductor substrate 1 of a first conductive type. Conductor 3 is then formed over a thin insulating film 14 in a portion of active region 1A in a manner as previously explained in connection with previous Example 5. End portion 3' of wiring 3 is made thinner in film thickness as shown in FIG. 7. This is accomplished by selective etching of the metal or polysilicon layer forming wiring 3 wherein regions of the layer forming portion 3' have been exposed to etching while wiring 3 has been masked with photo-resist. Upon formation of wiring 3 and portion 3', an oxide film 6 is deposited over them and then anisotropically etched to form sidewall 6A. Impurity diffusion region 4 comprising a second conductivity type is formed in region 1A and laterally extends beneath thin film wiring 3 in semiconductor substrate 1. Further, impurity diffusion region 7 comprising a first conductivity type is formed in diffusion region 4 and laterally beneath a portion of thin film wiring 3. Diffusion region 4 is provided to be of a greater depth than diffusion region 7. The distal width 8' between the impurity diffusion region 7 of the first conductive type and semiconductor substrate region 1B of the first conductive type has its narrowest extent beneath the thin portion 3' of wiring 3. As a result, the Hfe of the planar type bipolar transistor is controlled by base width 8' formed by impurity diffusion region 7 formed within impurity diffusion region 4. In FIG. 7, thin film portion 3' of conductor 3 includes sidewall 6A comprising an insulating film formed to be aligned with the extent of portion 3'. Insulating sidewall 6A is formed in same manner as previously explained.

The foregoing structure is a combination planar type bipolar transistor/MIS transistor. The semiconductor device comprises an npn bipolar transistor wherein substrate 1 of a first conductivity type functions as the collector domain, impurity diffusion region 7 of a first conductivity type functions as the emitter domain and impurity diffusion region 4 of a second conductivity type functions as the transistor base. Also, the structure functions as a MIS type n-channel semiconductor device wherein thin portion 3' of wiring 3 functions as a gate of the MIS device, semiconductor substrate 1 of a first conductive type functions as a drain domain, impurity diffusion region 7 of the first conductive type functions as a source domain and impurity diffusion region 4 of the second conductive type functioning as a substrate. In FIG. 7, the electrodes A, B, C and D of the semiconductor device of this combination planar type bipolar/MIS type semiconductor device together employing the same structure are MIS gate electrode A, bipolar collector/MIS drain electrode B, bipolar base/MIS substrate electrode C, and bipolar emitter/MIS source electrode D. FIG. 9A is an electrical circuit diagram for the semiconductor device of FIG. 7. Lateral bipolar transistor comprises p-type region 4 as a base, n-type region 7 as an emitter and n-type substrate 1 as a collector. MIS transistor comprises n-type region 7 as a source, portion 3' as a gate, p-type region 4 as a channel region below gate 3' and substrate 1 as a drain.

Further, the shape of wiring end portion 3' that functions as gate electrode A may possibly take on other geometric shapes as illustrated in FIGS. 8A and 8B. In FIG. 8A, the surface of end portion 3' is tapered. In FIG. 8B, the cutout form of end portion 3' is semicircular. FIGS. 7, 8A and 8B also illustrate that the thinness and, further, the contour of portion 3' provide for the formation of ion implanted region 4 therebetween and also function as the gate of the MIS transistor.

FIG. 9B is an electrical circuit diagram for a configuration of the device of FIG. 7 to function as a dual input NOR circuit and FIG. 9C is the logic table for circuit of FIG. 9B. The circuit of FIG. 9B differs from the circuit of FIG. 9A in that isolation is provided in substrate 1 so that the collector of bipolar transistor is isolated from the drain of the MIS transistor. Further a bias resistor is formed in substrate 1 for bipolar collector. Thus, it can be seen that the bipolar/MIS combination transistor device of this invention can be easily formed into simple circuit configurations taking up an area that is from ⅓ to 1/10 the area necessary in utilization of prior technology illustrated in FIG. 12, resulting in a high integration capability.

The method of forming the semiconductor device illustrated in FIG. 7 will now be explained in conjunction with FIGS. 10A-10H representing Example 7. In FIG. 10A, element separation insulating film 2 comprising a silicon oxide film having a thickness of 1 mm and an active element region 1A are formed on semiconductor substrate 1 of a first conductive type, e.g., an n-type conductive impurity comprising a $1 \times 10^{10}$ cm$^{-3}$ concentration of phosphorus in a silicon monocrystalline substrate. Next, thin layer insulating film 14 comprising a silicon oxide film having a thickness of 300 Å is formed over substrate 1. Next, as illustrated in FIG. 10B, a wiring film 3" is formed over thin insulating film 14. As an example, conductor film 3" may be polycrystalline silicon film having a thickness of about 4,000 Å and implanted with phosphorus which is diffused to a concentration $1 \times 12^{20}$ cm$^{-3}$. As an alternative to polycrystalline silicon, high melting point metals, such as, molybdenum or tungsten or compounds comprising such a high melting point metal and polycrystalline silicon may be employed as wiring 3. However, where a conductive material is employed whose main constituent is a low melting point metal, such as, aluminum, care must be taken since subsequent high temperature treatments cannot be performed after an impurity diffusion region is formed in semiconductor substrate 1.

Next, as illustrated in FIG. 10C, employing conventional photolithographic and etching techniques, conductor film 3" is selectively etched in order to form wiring in preselected places. The completion of etching leaves a thin etching conductor portion, e.g., having a thickness of 500 Å, but masking a portion 3 of film 3" where the MIS gate electrode is to be formed. With reference to FIG. 10D, impurity diffusion region 4 of a second conductive type is formed in semiconductor substrate 1 in active element region 1A beneath remaining thin conductor 3". This may be performed by an ion implant into silicon substrate 1 of the impurity, boron at a concentration of $5 \times 10^{14}$ cm$^{-2}$, by heat treatment to bring about diffusion and formation of p-type impurity diffusion region 4 having a depth of about 0.6 mm to 1 mm. In performing this process, impurity diffusion region 4 is self aligning since there will be no ion implant into silicon substrate 1 in regions beneath the conductor 4 and beneath element separation insulating film 2. In this connection, Active region 1B is masked with a photoresist so that injection of impurities will not occur in this region during the implant of region 4.

Next, as illustrated in FIG. 10E, insulating film 6 is formed over the entire surface of semiconductor substrate 1. As an example, film 6 may be a silicon oxide film having a thickness of about 0.5 μm (5,000 Å) and formed by conventional CVD. Sidewall 6A of insulating film 6 is thereafter formed on side surface of wiring 3 employing anisotropic dry etching, e.g., RIE, over the entire surface of the semiconductor substrate. As an example, the width of sidewall 6A can be made on the order of 3,000 Å by providing an etch back thickness for film 6 on the order of 6,000 Å. After performing this anisotropic etching, the thin conductor portion 3' that will comprise the gate electrode of the MIS type semiconductor device is formed in a self aligned manner beneath sidewall 6A in FIG. 10F by etching the thin conductor material remaining after the etching of the conductor with the sidewall 6A functioning as a mask. The etching of thin conductor material can be accomplished with dry etching employing a furon gas where polycrystalline silicon or a silicide is the conductor material.

As illustrated in FIG. 10G, impurity diffusion region 7 of a first conductive type is then formed in impurity diffusion region 4 in substrate 1 in a area adjacent to sidewall 6A utilizing a photoresist mask and conventional photolithographic techniques. In the present example, n-type impurity diffusion layer 6 is formed to a thickness of 0.2 μm by heat treatment after $5 \times 10^{15}$ cm$^{-2}$ ion implant of arsenic. Lastly, as shown in FIG. 10H, contact diffusions 9 and 19 are formed in a conventional manner for contact to region 4 and substrate 1.

It will be understood from the foregoing example that the semiconductor device of this invention made can vary the width of sidewall 9 by varying the film thickness to which the insulating film is etched by anisotropic etching when forming sidewall 9. In the discussed example, a sidewall 3,000 Å thick was formed by etching on the order of 600 Å. The base width of the lateral type bipolar from an impurity diffusion layer of the first conductive type and the channel width of the MIS type transistor formed at this time are about 4,000 Å. On the other hand, when the insulating film is etched on the order of 8,000 Å with anisotropic etching, the width of sidewall 9 will be 2,000 Å. The first conductive type impurity diffusion layer formed with the sidewall as a mask expands, and as a result the base width and channel width become 3,000 Å. That is, it will be understood that by following the structure of the semiconductor device of this invention, it is easy to control the capacity of semiconductor device, which is shown as the Hfe of the bipolar transistor that determines transistor capacity and the beta of the MIS type transistor.

Although the discussion has been in terms of an example showing successive steps of a method that uses a sidewall as a method of forming the gate electrode of MIS type semiconductor device, the same can also be done by varying the etching method of the gate electrode with shapes such as in FIG. 8A or FIG. 8B.

Although the foregoing explanation provided as an example a semiconductor device in which a npn-type planar type bipolar and an n-channel MIS type transistor are integrally formed together, it is obvious to those skilled in the art to also form a semiconductor device in which a pnp-type planar type bipolar and a p-channel transistor are integrally formed together by varying the conductivity types of the respective employed impurities.

While the invention has been described in conjunction with several specific embodiments, it is evident to those skilled in the art that many further alternatives, modifications and variations will be apparent in light of the foregoing description. For example, when variations are made in the sequences of impurity diffusion processes given in connection with the above examples, the goal of the invention will still be achieved as long as the processes of which the sequences are constructed remain the same. Thus, the invention described herein is intended to embrace all such alternatives, modifications, applications and variations as fall within the spirit and scope of the appended claims.

What is claimed is:

1. A method of manufacturing semiconductor device of the bipolar type wherein a junction of impurity diffusion regions of different conductive types are formed along the plane of a semiconductor substrate comprising the steps of:
   (a) forming an element separation region comprising an insulating film defining an active element region on said semiconductor substrate,
   (b) forming a wiring layer whose primary component is polycrystalline silicon containing impurity of a first conductivity type on at least a portion of said semiconductor substrate,
   (c) selectively removing a predetermined portion of said wiring layer to form a wiring wherein a first portion of said wiring is in contact with the active element region,
   (d) forming a diffusion region of a second conductivity type in a second portion of the active element region,
   (e) forming a first diffusion region of a first conductivity type in said semiconductor substrate beneath said wiring by diffusing impurity of a first conductivity type from said wiring into the active element region first portion,
   (f) forming an insulating film on the surface of said device,
   (g) etching back said insulating film substantially to the substrate surface forming an insulating sidewall on a side surface of said wiring and along said substrate plane adjacent to the active element region second portion,
   (h) forming a second diffusion region of a first conductivity type in a region adjacent to said sidewall and in said second conductivity type diffusion region thereby creating a channel region between said first and second diffusion regions formed in said semiconductor substrate, and
   (i) selectively determining the initially deposited height of said insulating film for forming said sidewall so that a prescribed width of said sidewall along said substrate plane is accurately formed upon the completion of the etching step and, correspondingly, a resultant prescribed length is provided to said channel region along said semiconductor substrate plane.

2. The method of claim 1 including the step of controlling the width of said sidewall along said semiconductor substrate plane by initially selecting a deposited film thickness of said insulating film prior to etching said film and etching said film to said semiconductor substrate surface leaving said sidewall of a determined width governed by said selected film thickness.

3. A method of manufacturing semiconductor device of the bipolar type wherein a junction of impurity diffusion regions of different conductive types are formed along the plane of a semiconductor substrate comprising the steps of:
   (a) forming an element separation region comprising an insulating film defining an active element region on said semiconductor substrate,
   (b) forming a thin insulating film on the active element region surface,
   (c) selectively removing a portion of said thin insulating film,
   (d) forming a wiring layer whose primary component is polycrystalline silicon containing impurity of a first conductivity type on at least a portion of said semiconductor substrate,
   (e) selectively removing a predetermined portion of said wiring layer to form a wiring over a first portion of the active element region wherein at least a portion of said wiring is formed over said thin insulating film,
   (f) forming a diffusion region of a second conductivity type in a second portion of the active element region including an area beneath said thin insulating film,
   (g) forming a first diffusion region of a first conductivity type in said semiconductor substrate beneath said wiring by diffusing impurity of a first conductivity type from said wiring into said active element region first portion including an area beneath said thin insulating film,
   (h) depositing an insulating film on the surface of said device,
   (h) etching back said insulating film substantially to the substrate surface forming an insulating sidewall on a side surface of said wiring and along said substrate plane adjacent to the active element region second portion,
   (i) forming a second diffusion region of a first conductivity type in a region adjacent to said sidewall and in said second conductivity type diffusion region thereby creating a channel region between the first and second diffusion regions formed in said semiconductor substrate, and
   (j) selectively determining the initially deposited height of said insulating film for forming said sidewall so that a prescribed width of said sidewall along said substrate plane is accurately formed upon the completion of the etching step and, correspondingly, a resultant prescribed length is provided to said channel region along said semiconductor substrate plane.

4. The method of claim 3 including the step of controlling the width of said sidewall along said semiconductor substrate plane by initially selecting a deposited film thickness of the insulating film prior to etching said film and etching said film to said semiconductor substrate leaving said sidewall of a determined width governed by said selected film thickness.

5. A method of manufacturing semiconductor device of the bipolar type wherein a junction of impurity diffusion regions of different conductive types are formed along the plane of a semiconductor substrate comprising the steps of:
   (a) forming an element separation region comprising an insulating film defining an active element region on said semiconductor substrate,
   (b) forming a wiring layer whose primary component is polycrystalline silicon containing impurity of a first conductivity type on at least a portion of said semiconductor substrate,
   (c) selectively removing a predetermined portion of said wiring layer to form a wiring wherein a first portion of said wiring is in contact with the active element region,
   (d) forming a first diffusion region of a first conductivity type in said semiconductor substrate beneath said wiring by diffusing impurity of a first conductivity type from said wiring into the active element region first portion,
   (e) depositing an insulating film on the surface of said device,
   (f) etching back said insulating film substantially to the substrate surface forming an insulating sidewall on a side surface of said wiring and along said substrate plane adjacent to the active element region second portion,
   (g) forming a second diffusion region of a first conductivity type in a region adjacent to said sidewall and in a second portion of said active element region wherein a channel region is established between said first and second formed diffusion regions, and
   (h) selectively determining the initially deposited height of said insulating film forming said sidewall so that a prescribed width of said sidewall along said substrate plane is accurately formed upon the completion of the etching step and, correspondingly, a resultant prescribed length is provided to said channel region along said semiconductor substrate plane.

6. A method of manufacturing semiconductor device of the bipolar type wherein a junction of impurity diffusion regions of different conductive types are formed along the plane of a semiconductor substrate comprising the steps of:
   (a) forming an element separation region comprising an insulating film defining an active element region on said semiconductor substrate,
   (b) forming a wiring layer whose primary component is polycrystalline silicon containing impurity of a first conductivity type on at least a portion of said semiconductor substrate,
   (c) selectively removing a predetermined portion of said wiring layer to form a wiring wherein a first portion of said wiring is in contact with the active element region,
   (d) depositing an insulating film on the surface of said device,
   (g) etching back said insulating film substantially to the substrate surface forming an insulating sidewall on a side surface of said wiring and along said substrate plane adjacent to the active element region second portion, and
   (e) forming a diffusion region of a first conductivity type in a region adjacent to and extending in a portion of a region in said substrate beneath said sidewall in said active element region by injection diffusion of an impurity of a first conductivity type contained in said wiring, and
   (f) selectively determining the initially deposited height of said insulating film forming said sidewall so that a prescribed width of said sidewall along said substrate plane is accurately formed upon the completion of the etching step and, correspondingly, a resultant prescribed length is provided to said region portion beneath said sidewall.

7. A method of manufacturing a semiconductor device of the bipolar type formed along the plane of a semiconductor substrate comprising the steps of:
   (a) forming a thin insulating film over a semiconductor substrate of a first conductivity type,
   (b) selectively forming interconnect wiring over the semiconductor substrate wherein at least a portion of said wiring is separated from said substrate by said thin insulating film, said wiring portion utilized in forming a first diffusion region of a first conductivity type in said substrate comprising a collector region,
   (c) forming a diffusion region of a second conductivity type laterally adjacent to said wiring in a portion of said semiconductor substrate, said second conductive type impurity diffusion region comprising a base region,
   (d) forming a sidewall comprising an insulating film on the side surface of said wiring and along said substrate plane, said sidewall formed substantially over said base region, and
   (e) forming a second diffusion region of a first conductivity type in said substrate extending horizontally adjacent to said sidewall in a portion of said second conductivity type diffusion region, said second diffusion region comprising an emitter region with said base region extending between said emitter region and said collector region, and
   (f) selectively determining the initially deposited height of said insulating film for forming said sidewall so that a prescribed width of said sidewall along said substrate plane is accurately formed upon the completion of the etching step and, correspondingly, a resultant prescribed length is provided to said channel region along said semiconductor substrate plane.

8. The method of claim 7 wherein said selectively formed wiring is formed employing photolithographic techniques and comprises polycrystalline silicon or a high melting point metal.

9. The method of claim 7 including the steps of forming an insulating film of prescribed thickness over said semiconductor substrate after step (b) of forming said second conductive type diffusion region, anisotropic dry etching back said insulating film to form said sidewall on a side surface of said wiring.

10. The method of claim 7 including the step of controlling the width of said sidewall along said semiconductor substrate plane by initially selecting a deposited film thickness of said insulating film prior to etching said film and etching said film to said said second conductivity type diffusion region, said second diffusion region comprising an emitter region with said base region extending between said emitter region and said collector region, and (e) selectively determining the initially deposited height of said insulating film for forming said sidewall so that a prescribed width of said sidewall along said substrate plane is accurately formed upon the completion of the etching step and, correspondingly, a resultant prescribed length is provided to said channel region along said semiconductor substrate plane.

11. The method of claim 3 wherein, in step (e), a first portion of the formed wiring is in contact with the active element region first portion and a second adjoining portion is formed over said thin insulating film.

12. The method of claim 7 wherein, in step (b), a first portion of said wiring is separated from said substrate by said thin insulating film and a second portion of said wiring is in contact with said substrate.

13. A method of manufacturing a semiconductor device of the bipolar type formed along the plane of a semiconductor substrate comprising the steps of:

(a) selectively forming interconnect wiring over the semiconductor substrate wherein at least a portion of said wiring is in contact with said substrate, said wiring portion utilized in forming a first diffusion region of a first conductivity type in said substrate comprising a collector region, (b) forming a diffusion region of a second conductivity type laterally adjacent to said wiring in a portion of said semiconductor substrate, said second conductive type impurity diffusion region comprising a base region, (c) forming a sidewall comprising an insulating film on the side surface of said wiring and along said substrate plane, said sidewall formed substantially over said base region, and (d) forming a second diffusion region of a first conductivity type in said substrate extending horizontally adjacent to said sidewall in a portion of said second conductivity type diffusion region, said second diffusion region comprising an emitter region with said base region extending between said emitter region and said collector region, and (e) selectively determining the initially deposited height of said insulating film for forming said sidewall so that a prescribed width of said sidewall along said substrate plane is accurately formed upon the completion of the etching step and, correspondingly, a resultant prescribed length is provided to said channel region along said semiconductor substrate plane.

* * * * *

UNITED STATES PATENT AND TRADEMARK OFFICE
CERTIFICATE OF CORRECTION

PATENT NO. : 5,281,544
DATED : January 25, 1994
INVENTOR(S) : Toshihiko Higuchi

It is certified that error appears in the above-indentified patent and that said Letters Patent is hereby corrected as shown below:

Column 17, line 7, beginning at "said second conductivity", delete the remainder of Claim 10 through line 9, and isnert the following after "film to said":

--semiconductor substrate surface leaving said sidewall of a determined width governed by said selected film thickness--.

Signed and Sealed this

Thirteenth Day of December, 1994

Attest:

BRUCE LEHMAN

Attesting Officer

Commissioner of Patents and Trademarks